United States Patent [19]

Toyoda et al.

[11] Patent Number: 5,721,501
[45] Date of Patent: Feb. 24, 1998

[54] FREQUENCY MULTIPLIER AND SEMICONDUCTOR INTEGRATED CIRCUIT EMPLOYING THE SAME

[75] Inventors: Kenji Toyoda; Jun Setogawa, both of Yokohama, Japan

[73] Assignee: Kabushiki Kaisha Toshiba, Kawasaki, Japan

[21] Appl. No.: 684,713

[22] Filed: Jul. 22, 1996

[30] Foreign Application Priority Data

Jul. 26, 1995 [JP] Japan ................................. 7-190110

[51] Int. Cl.$^6$ .................................................. H03B 19/00
[52] U.S. Cl. ........................................... 327/116; 377/47
[58] Field of Search ................................. 327/105, 106, 327/107, 113, 114, 115, 116, 119, 172, 173, 174, 175, 176, 261; 377/47, 48

[56] References Cited

U.S. PATENT DOCUMENTS

| 4,777,448 | 10/1988 | Satoh ........................................ 327/116 |
| 4,799,022 | 1/1989 | Skierszkan ................................ 327/116 |
| 5,057,784 | 10/1991 | Park ......................................... 327/116 |
| 5,321,743 | 6/1994 | Ogata ........................................ 327/116 |
| 5,530,387 | 6/1996 | Kim .......................................... 327/116 |
| 5,548,235 | 8/1996 | Marbot ...................................... 327/116 |
| 5,614,841 | 3/1997 | Marbot et al. ............................ 327/116 |

FOREIGN PATENT DOCUMENTS 401152815  6/1989  Japan .................................... 327/116

*Primary Examiner*—Timothy P. Callahan
*Assistant Examiner*—My-Trang Nu Ton
*Attorney, Agent, or Firm*—Oblon, Spivak, McClelland, Maier & Neustadt, P.C.

[57] ABSTRACT

A frequency multiplier has a delay circuit consisting of delay units each having a delay time and being connected in series to sequentially delay an input clock signal, a pulse width detector for measuring and storing the width of a pulse of the input clock signal according to the outputs of the delay units, a first selector for selecting one of the outputs of the delay units according to the output of the pulse width detector, a second selector for selecting one of the inverted outputs of the delay units according to the output of the pulse width detector, and first and second output flip-flops. The first and second output flip-flops are reset according to the outputs of the first and second selectors and are set in response to rising and falling edges of the input clock signal, to generate a frequency-multiplied clock signal.

15 Claims, 9 Drawing Sheets

DUTY FACTOR OF 50%

BUS OPERATION

DUTY ABERRATION (BROADER HIGH-LEVEL-WIDTH)

BUS OPERATION

DUTY ABERRATION (BROADER LOW-LEVEL-WIDTH)

BUS OPERATION

FREQUENCY MULTIPLIER AND SEMICONDUCTOR INTEGRATED CIRCUIT EMPLOYING THE SAME

BACKGROUND OF THE INVENTION

1. Field of the Invention

The present invention relates to a frequency multiplier for multiplying the frequency of an input clock signal and providing a frequency-multiplied clock signal, and a semiconductor integrated circuit employing the same.

2. Description of the Prior Art

There are a variety of clock signal supply circuits used for semiconductor integrated circuits, and among them are frequency multipliers. FIG. 1 shows a frequency multiplier according to a first prior art. This has a delay circuit 201 and an exclusive OR (EX-OR) circuit 202. An input clock signal IN is passed through the delay circuit 201 to an input terminal of the EX-OR circuit 202. At the same time, the signal IN is directly supplied to the other input terminal of the EX-OR circuit 202, which generates a frequency-multiplied clock signal OUT.

Semiconductor integrated circuits involve, even if they are of the same kind, variations in their characteristics depending on wafers or batches used to fabricate them. Such variations are caused during manufacturing due to interface states between a transistor's gate oxide film and a semiconductor substrate, uneven diffusion depths, or pattern misalignment and influence the performance of the frequency multiplier of FIG. 1. For example, a threshold voltage $V_{th}$ of a MOSFET usually has an allowance of ±30% when it is used for a device other than a delay circuit. For the delay circuit, the $V_{th}$ allowance of ±30% is equal to a fluctuation of ±30% in a delay time. The delay time of the delay circuit 201 is also affected by a fluctuation in an external source voltage. When the source voltage fluctuates, for example, between 5 V and 3 V, the delay time will fluctuate by about 50%. The source voltage fluctuation is added to the manufacturing variations, to greatly change the delay time of the delay circuit 201, thereby changing the duty factor of the input signal.

FIG. 2 shows a frequency multiplier according to a second prior art employing an analog structure. This has operational amplifiers 211 and 212 each having a positive input terminal (+) that receives an input clock signal IN. Negative input terminals (−) of the amplifiers 211 and 212 receive reference voltages LV1 and LV2, respectively. The reference voltages have a relationship of, for example, LV1 >LV2. The reference voltage LV1 is a resistor-divided voltage supplied from a node N1 between resistors 213 and 214 that are connected in series between a source voltage VDD and a ground GND. The reference voltage LV2 is a resistor-divided voltage supplied from a node N2 between resistors 215 and 216 that are connected in series between the source voltage VDD and the ground GND. The amplifiers 211 and 212 supply outputs Out1 and Out2, respectively, to an EX-OR circuit 217, which provides a frequency-multiplied clock signal OUT. FIG. 3 is a waveform diagram showing the operation of the frequency multiplier of FIG. 2. Since LV1>LV2, the amplifiers 211 and 212 have different thresholds, and therefore, edges of the outputs Out1 and Out2 differ from each other. The EX-OR circuit 217 processes these outputs to provide the frequency-multiplied signal OUT.

Unlike the first prior art, the second prior art is resistible to manufacturing variations. The second prior art, however, malfunctions or stops under a low voltage and consumes large current when operating at high frequencies. Consequently, the second prior art is improper for an application of low power consumption.

SUMMARY OF THE INVENTION

An object of the present invention is to provide a frequency multiplier capable of keeping an initial duty factor irrespective of manufacturing variations or source voltage fluctuations.

Another object of the present invention is to provide a frequency multiplier capable of correcting a change in the duty factor of an input clock signal due to manufacturing variations such as the $V_{th}$ variations or source voltage fluctuations.

Still another object of the present invention is to provide a semiconductor integrated circuit having a frequency multiplier capable of always operating correctly irrespective of fluctuations in the characteristics of the elements thereof due to manufacturing variations.

In order to accomplish the objects, a first aspect of the present invention provides a frequency multiplier of FIG. 4. This has a delay circuit 10 consisting of series-connected delay units 11 to 18 each having a given delay time for successively delaying an input clock signal IN. A rise detector consisting of elements 21 and 22 detects a rising edge of the signal IN. A fall detector consisting of elements 23 and 24 detects a falling edge of the signal IN. A pulse width detector 30 measures and stores the width of a pulse of the signal IN according to the outputs of the delay units 11 to 18. A first selector 50 selects one of the outputs of the delay units 11 to 18 according to the output of the pulse width detector 30. A second selector 60 selects one of the inverted outputs of the delay units 11 to 18 according to the output of the pulse width detector 30. A first output flip-flop 81 is reset according to the output of the first selector 50 and is set in response to a rising edge of the signal IN. A second output flip-flop 82 is reset according to the output of the second selector 60 and is set in response to a falling edge of the signal IN. An output circuit 83 synthesizes the outputs of the flip-flops 81 and 82 and provides a frequency-multiplied clock signal OUT. The pulse width detector 30 consists of flip-flops 31 to 34 that are set in response to a rising edge of the signal IN, and latches 35 to 38 that latch the outputs of the flip-flops 31 to 34, respectively, in response to a falling edge of the signal IN.

FIG. 5 shows signals in the frequency multiplier of FIG. 4. The pulse width detector 30 measures and stores the width of a high- or low-level pulse of the signal IN according to the outputs of the delay units 11 to 18. In the next cycle, the first selector 50 selects one of the outputs of the delay units 11 to 18 according to the output of the pulse width detector 30. At this time, the second selector 60 selects one of the inverted outputs of the delay units 11 to 18. The outputs of the selectors 50 and 60 reset the flip-flops 81 and 82, respectively, which are set in response to rising and falling edges of the signal IN, respectively. The outputs of the flip-flops 81 and 82 are used to generate the frequency-multiplied clock signal OUT. In this way, the present invention measures the width of a pulse of the signal IN every clock cycle and selects one of the delay units 11 to 18 according to the measured pulse width. Namely, the frequency multiplier of the present invention is capable of dealing with manufacturing variations and source voltage fluctuations, to maintain an initial duty factor. The frequency multiplier of the present invention operates under low current or voltage, to reduce power dissipation. For example, the delay circuits of the prior arts consume a current of about 1 mA at 10 MHz. On the other hand, the delay circuit of the present invention consumes a current of only about 0.5 mA at 20 MHz.

A second aspect of the present invention provides a frequency multiplier of FIG. 6. This has a delay circuit 10 consisting of series-connected delay units 11 to 18 each having a given delay time to successively delay an input clock signal IN. A rise detector consisting of elements 21 and 22 detects a rising edge of the signal IN. A fall detector consisting of elements 24 and 25 detects a falling edge of the signal IN. A first pulse width detector 30 measures and stores the width of a high-level pulse of the signal IN according to the outputs of the delay units 11 to 18. A second pulse width detector 90 measures and stores the width of a low-level pulse of the signal IN according to the outputs of the delay units 11 to 18. A first selector 50 selects one of the outputs of the delay units 11 to 18 according to the output of the first pulse width detector 30. A second selector 60 selects one of the inverted outputs of the delay units 11 to 18 according to the output of the second pulse width detector 90. A first output flip-flop 81 is reset according to the output of the first selector 50 and is set in response to a rising edge of the signal IN. A second output flip-flop 82 is reset according to the output of the second selector 60 and is set in response to a falling edge of the signal IN. An output circuit 83 synthesizes the outputs of the flip-flops 81 and 82 and provides a frequency-multiplied clock signal OUT. The first pulse width detector 30 consists of flip-flops 31 to 34 that are reset according to the outputs of the delay units 11 to 18 and are set in response to a rising edge of the signal IN, and latches 35 to 38 that latch the outputs of the flip-flops 31 to 34 in response to a falling edge of the signal IN. The second pulse width detector 90 consists of flip-flops 91 to 94 that are reset according to the inverted outputs of the delay units 11 to 18 and are set in response to a falling edge of the signal IN, and latches 95 to 98 that latch the outputs of the flip-flops 91 to 94 in response to a rising edge of the signal IN.

The first and second pulse width detectors 30 and 90 measure and store the widths of high- and low-level pulses of the signal IN according to the outputs of the delay units 11 to 18. In the next cycle, the first and second selectors 50 and 60 select each one of the delay units 11 to 18 according to the outputs of the first and second pulse width detectors 30 and 90, to generate the frequency-multiplied clock signal OUT similar to the first aspect. In this way, the second aspect measures the widths of high- and low-level pulses of the signal IN every clock cycle and selects one of the delay units 11 to 18 according to the measured pulse widths, thereby surely correcting a change in the duty factor of the signal IN due to manufacturing variations or source voltage fluctuations. The second aspect consumes small power and operates under low voltage.

A third aspect of the present invention provides a semiconductor integrated circuit of FIG. 9. This circuit employs a frequency multiplier as a part thereof. The frequency multiplier of any one of the first and second aspects of the present invention is capable of dealing with fluctuations in the characteristics of the elements thereof. The circuit of FIG. 9 employs such a frequency multiplier as a part thereof. The frequency multiplier 120 provides a frequency-multiplied clock signal OUT to turn on and off a charge transistor 112 for precharging a bus line 111. The frequency multiplier 120 is capable of dealing with manufacturing variations or source voltage fluctuations, to correctly provide the frequency-multiplied clock signal OUT for the transistor 112. The third aspect is capable of securing the duty factor of the signal OUT for the semiconductor integrated circuit at, for example, 50% to always correctly operate the circuit. The semiconductor integrated circuit, therefore, is not affected by manufacturing variations. Accordingly, the third aspect is effective to mass-produce semiconductor integrated circuits at low cost and high yield. The third aspect is capable of providing a high-frequency signal at low power dissipation, and therefore, is useful for fabricating high-density semiconductor integrated circuits such as VLSIs, ULSIs, and gigascale integrations (GSIs).

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
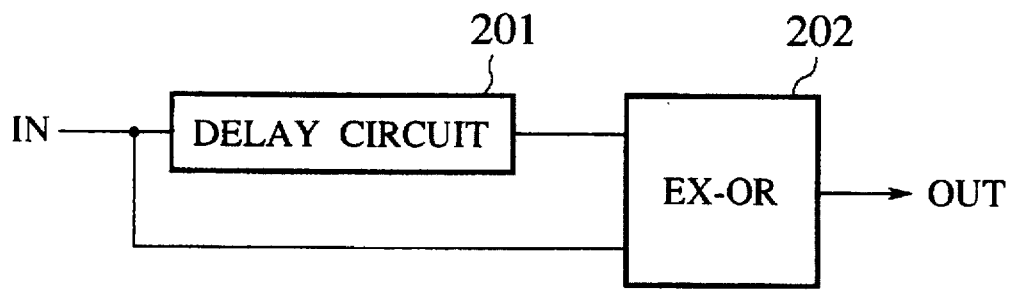
FIG. 1 is a circuit diagram showing the frequency multiplier of the first prior art.
Figure 2:
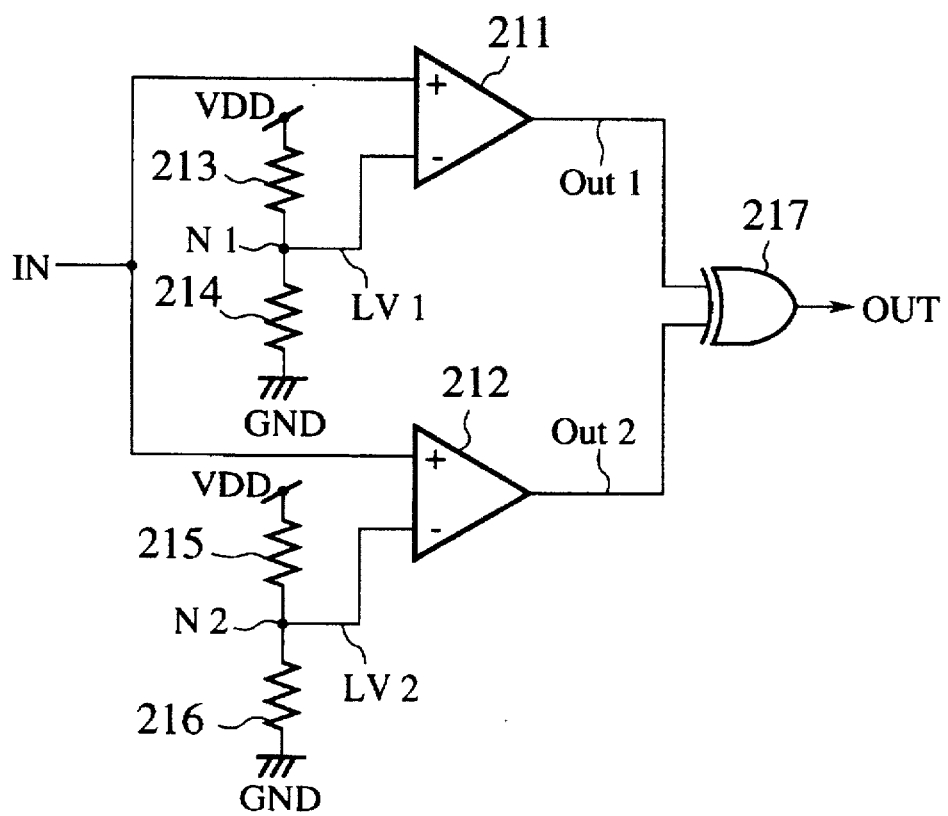
FIG. 2 is a circuit diagram showing the frequency multiplier of the second prior art.
Figure 3:
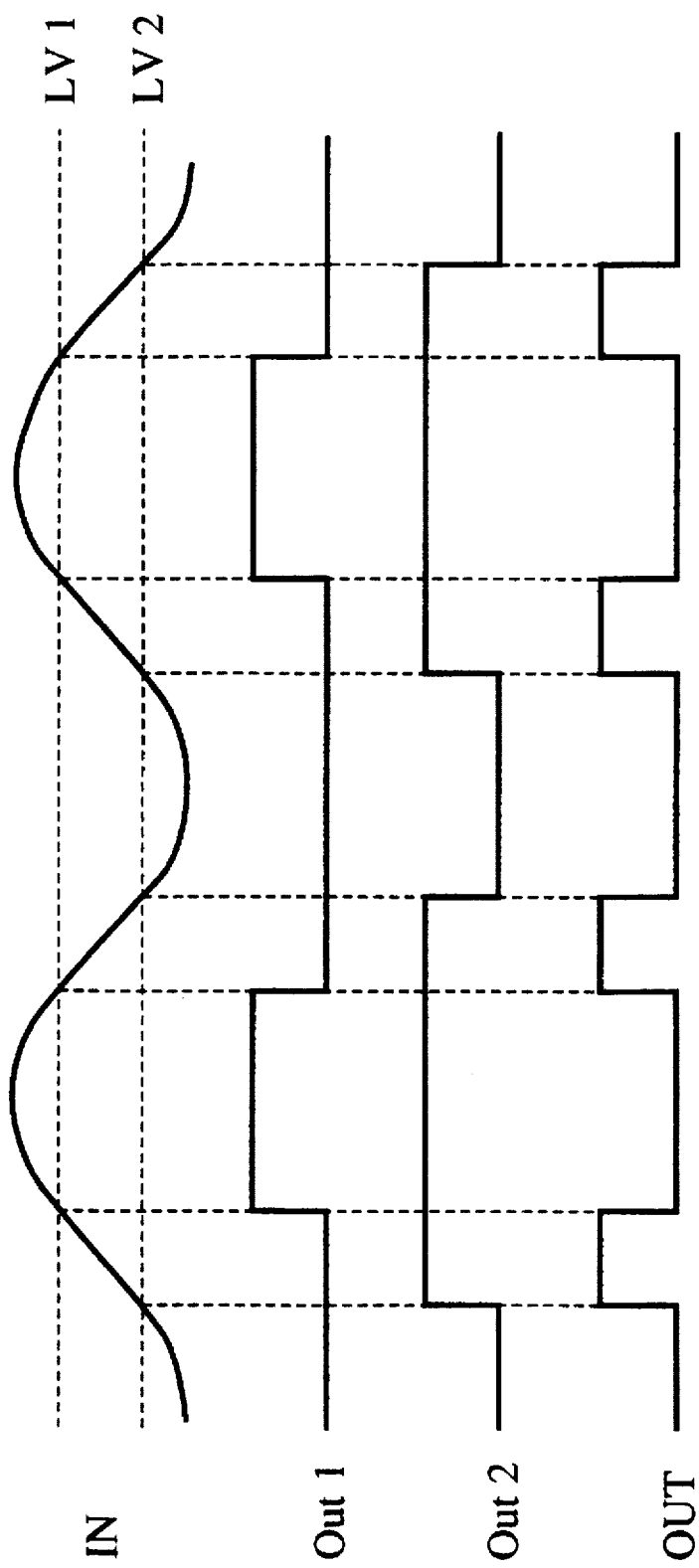
FIG. 3 is a waveform diagram showing the operation of the prior art of FIG. 2.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 4:
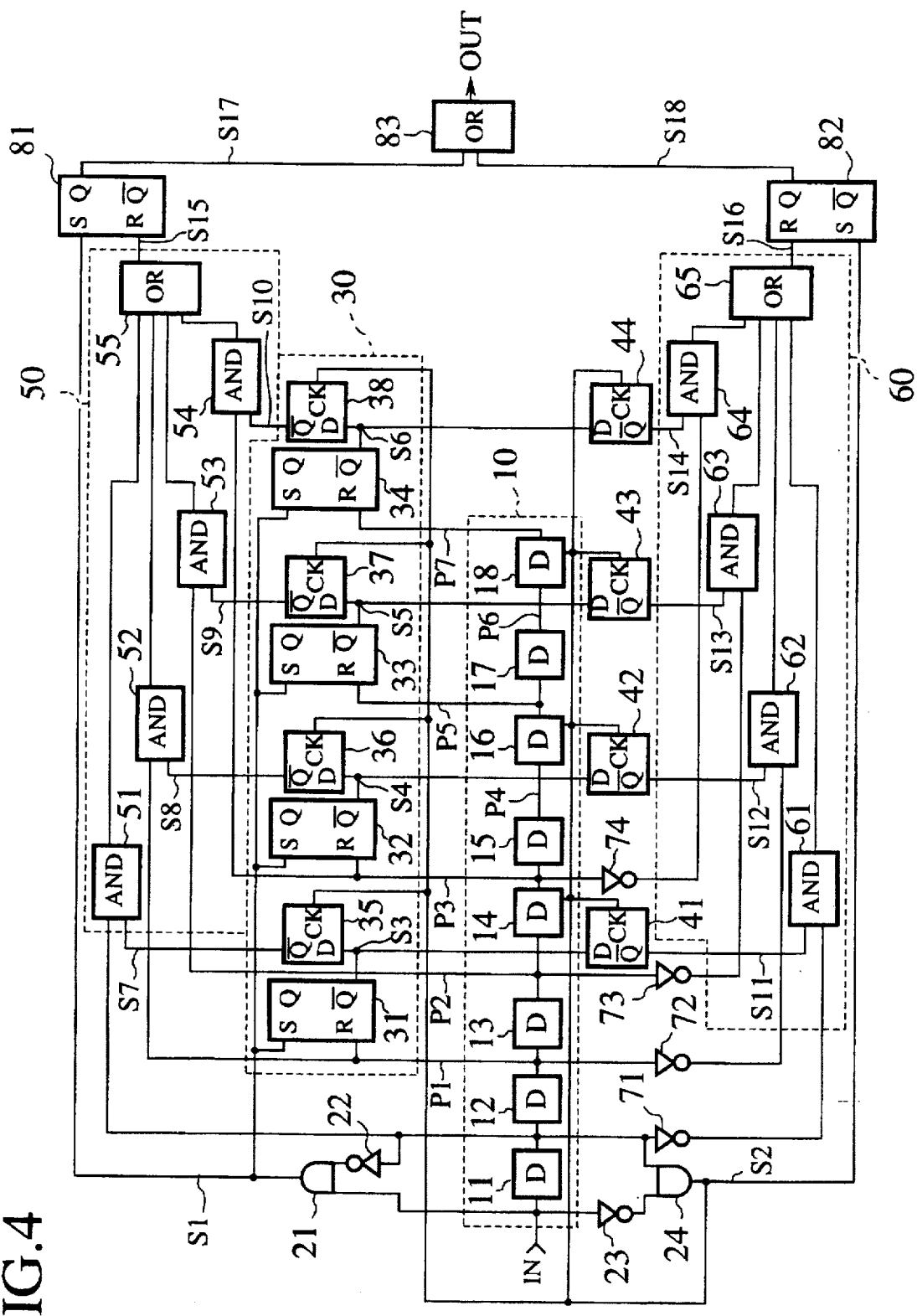
FIG. 4 is a circuit diagram showing a frequency multiplier according to a first embodiment of the present invention.

FIG. 4 is a circuit diagram showing a frequency multiplier according to the first embodiment of the present invention. This has a delay circuit 10 for receiving an input clock signal IN, a pulse width detector 30 for measuring and storing the width of a pulse of the signal IN according to the output of the delay circuit 10, a first selector 50 for selecting one of the outputs of delay units 11 to 18 of the delay circuit 10 according to the output of the pulse width detector 30, a second selector 60 for selecting one of the inverted outputs of the delay units 11 to 18 according to the output of the pulse width detector 30, a first output flip-flop 81 that is reset according to the output of the first selector 50 and is set in response to a rising edge of the signal IN, a second output flip-flop 82 that is reset according to the output of the second selector 60 and is set in response to a falling edge of the signal IN, and an output circuit 83 for synthesizing the outputs of the flip-flops 81 and 82 and providing a frequency-multiplied clock signal OUT.

The delay units 11 to 18 of the delay circuit 10 are connected in series and have each a given delay time. An input terminal of the first delay unit 11 is connected to an input terminal of an AND gate 21, and an output terminal of the delay unit 11 is connected to the other input terminal of the AND gate 21 through an inverter 22. An output terminal of the AND gate 21 provides a shot pulse S1 indicating a rising edge of the signal IN. The delay unit 11 is also connected to an inverter 23 and an AND gate 24, to generate a shot pulse S2 indicating a falling edge of the signal IN.

The delay circuit 10 is connected to the pulse width detector 30 that measures the width of a high-level pulse of the signal IN. The pulse width detector 30 consists of flip-flops 31 to 34 and latches 35 to 38. An inverted output terminal $\bar{Q}$ of each of the flip-flops 31 to 34 is connected to a data input terminal D of a corresponding one of the latches 35 to 38. Reset terminals R of the flip-flops 31 to 34 receive the outputs P1, P3, P5, and P7 of the second, fourth, sixth, and eighth delay units 12, 14, 16, and 18, respectively. Set terminals S of the flip-flops 31 to 34 receive the shot pulse S1. Clock terminals CK of the latches 35 to 38 receive the shot pulse S2. Inverted output terminals $\bar{Q}$ of the latches 35 to 38 provide signals S7 to S10, respectively. The pulse width detector 30 provides signals S3 to S6 to data input terminals D of latches 41 to 44, respectively. Clock terminals CK of the latches 41 to 44 receive the shot pulse S2. Inverted output terminals $\bar{Q}$ of the latches 41 to 44 provide signals S11 to S14, respectively.

The signals S7 to S10 of the latches 35 to 38 are supplied to the first selector 50. The signals S11 to S14 of the latches 41 to 44 are supplied to the second selector 60. The first selector 50 has AND gates 51 to 54 and an OR gate 55. The AND gate 51 receives the output of the first delay unit 11, and the AND gates 52 to 54 receive the outputs P1 to P3 of the second to fourth delay units 12 to 14, respectively. The AND gates 51 to 54 also receive the outputs S7 to S10 of the latches 35 to 38, respectively. The OR gate 55 receives the outputs of the AND gates 51 to 54 and provides a selected signal S15.

Similarly, the second selector 60 consists of AND gates 61 to 64 and an OR gate 65. The AND gate 61 receives the output of the first delay unit 11 through an inverter 71, and the AND gates 62 to 64 receive the signals P1 to P3 of the delay units 12 to 14 through inverters 72 to 74, respectively. The AND gates 61 to 64 also receive the signals S11 to S14, respectively. The OR gate 65 receives the outputs of the AND gates 61 to 64 and provides a selected signal S16.

An output part of the frequency multiplier consists of the first and second output flip-flops 81 and 82 and OR gate 83. A set terminal S of the flip-flop 81 receives the shot pulse S1, a reset terminal R thereof receives the selected signal S15 from the first selector 50, and an output terminal Q thereof supplies a signal S17 to an input terminal of the OR gate 83. A set terminal S of the flip-flop 82 receives the shot pulse S2, a reset terminal R thereof receives the selected signal S16 from the second selector 60, and an output terminal Q supplies a signal S18 to the other input terminal of the OR gate 83. The OR gate 83 provides the frequency-multiplied clock signal OUT whose frequency is, for example, twice as large as that of the signal IN.

The operation of the frequency multiplier of the first embodiment will be explained with reference to the timing chart of FIG. 5. At time t1, the AND gate 21 provides the shot pulse S1 in response to a rising edge of the signal IN, to set the flip-flops 31 to 34 and 81. As a result, the signals S3 to S6 fall, the signal S17 stays at HIGH, and the output clock signal OUT stays at HIGH.

The outputs P1 to P7 of the delay units 12 to 18 rise one after another in response to the signal IN, to reset the flip-flops 31 to 34 accordingly. Then, the signals S3 to S6 fallen at time t1 rise at times t2 to t6, respectively.

At time t5, the AND gate 24 provides the shot pulse S2 in response to a fall of the signal IN. The latches 35 to 37 and 41 to 43 store the signals S3 to S5 that are each at HIGH, and the latches 38 and 44 store the signal S6 that is at LOW. The inverted output signals S7 to S10 of the latches 35 to 38 are at LOW, LOW, LOW, and HIGH, respectively, and the inverted output signals S11 to S14 of the latches 41 to 44 are also at LOW, LOW, LOW, and HIGH, respectively. Since the signal S10 is HIGH, the output of the AND gate 54 is HIGH, and therefore, the selected signal S15 of the selector 50 rises to reset the flip-flop 81. As a result, the signal S17 from the flip-flop 81 falls. On the other hand, the flip-flop 82 is set to provide the signal S18 of HIGH. Consequently, the output clock signal OUT is kept at HIGH.

After time t6, the signals P1 to P7 fall one after another. At time t7 when the signal P8 falls, the output of the AND gate 54 becomes LOW, and therefore, the signal S15 from the OR gate 55 falls. At this time, the flip-flop 81 is still under the reset state, and the signal S17 is at LOW. On the other hand, the output of the AND gate 64 changes to HIGH, and the selected output S16 of the selector 60 rises. As a result, the flip-flop 82 is reset, the signal S18 changes to LOW, and the output clock signal OUT falls.

At time t8, the next cycle starts, and the shot pulse S1 is provided. Similar to the preceding cycle, the flip-flops 31 to 34 and 81 are set, the signals S3 to S6 fall, and the signal S17 rises. As a result, the output clock signal OUT changes to HIGH.

Similar to the preceding cycle, the signals P1 to P7 rise one after another to reset the flip-flops 31 to 34 successively. Accordingly, the signals S8 to S6 fallen at time t8 rise at times t9 to t11, respectively. When the signal P3 rises at time t10, the output of the AND gate 54 becomes HIGH. As a result, the signal S15 changes to HIGH, the flip-flop 81 is reset, and the signal S17 falls. On the other hand, the output of the AND gate 64 changes to LOW, the selected output S16 of the selector 60 becomes LOW, and the flip-flop 82 maintains the reset state. The signal S18, therefore, is unchanged at LOW. Consequently, the output clock signal OUT falls.

At time t12, the AND gate 24 again provides the shot pulse S2. At this time, the levels of the signals S3 to S6 are unchanged from the preceding cycle. As a result, the inverted outputs S7 to S10 of the latches 35 to 38 and the inverted outputs S11 to S14 of the latches 41 to 44 are maintained at LOW, LOW, LOW, and HIGH, respectively. Since the output of the AND gate 54 stays at HIGH, the selected signal S15 of the selector 50 is HIGH, and the signal S17 stays at LOW. On the other hand, the flip-flop 82 is set, the signal S18 rises, and therefore, the output clock signal OUT rises.

Operations from t12 to t14 are the same as those from t5 to t8. These operations are repeated, and the frequency of the output clock signal OUT becomes twice as large as that of the signal IN.

In this way, the first embodiment sets the flip-flops 31 to 34 of the pulse width detector 30 in response to a rising edge of the signal IN and sequentially resets the flip-flops 31 to 34 through the delay circuit 10 until the next rise of the signal IN, to thereby measure the width of a high-level pulse of the signal IN and store the width in the latches 31 to 34 and 41 to 44.

According to data in these latches, the first embodiment selects one of the delay units 11 to 18 in the next cycle (the output P3 of the delay unit 14 is selected in the embodiment), to set the flip-flop 81 in response to a rising edge of the signal IN and the flip-flop 82 in response to a falling edge of the same. The first embodiment resets the flip-flops 81 and 82 according to the signals S15 and S16 that are selected according to the data of the preceding cycle, to generate the output clock signal OUT whose frequency is twice as large as that of the signal IN.

Figure 5:
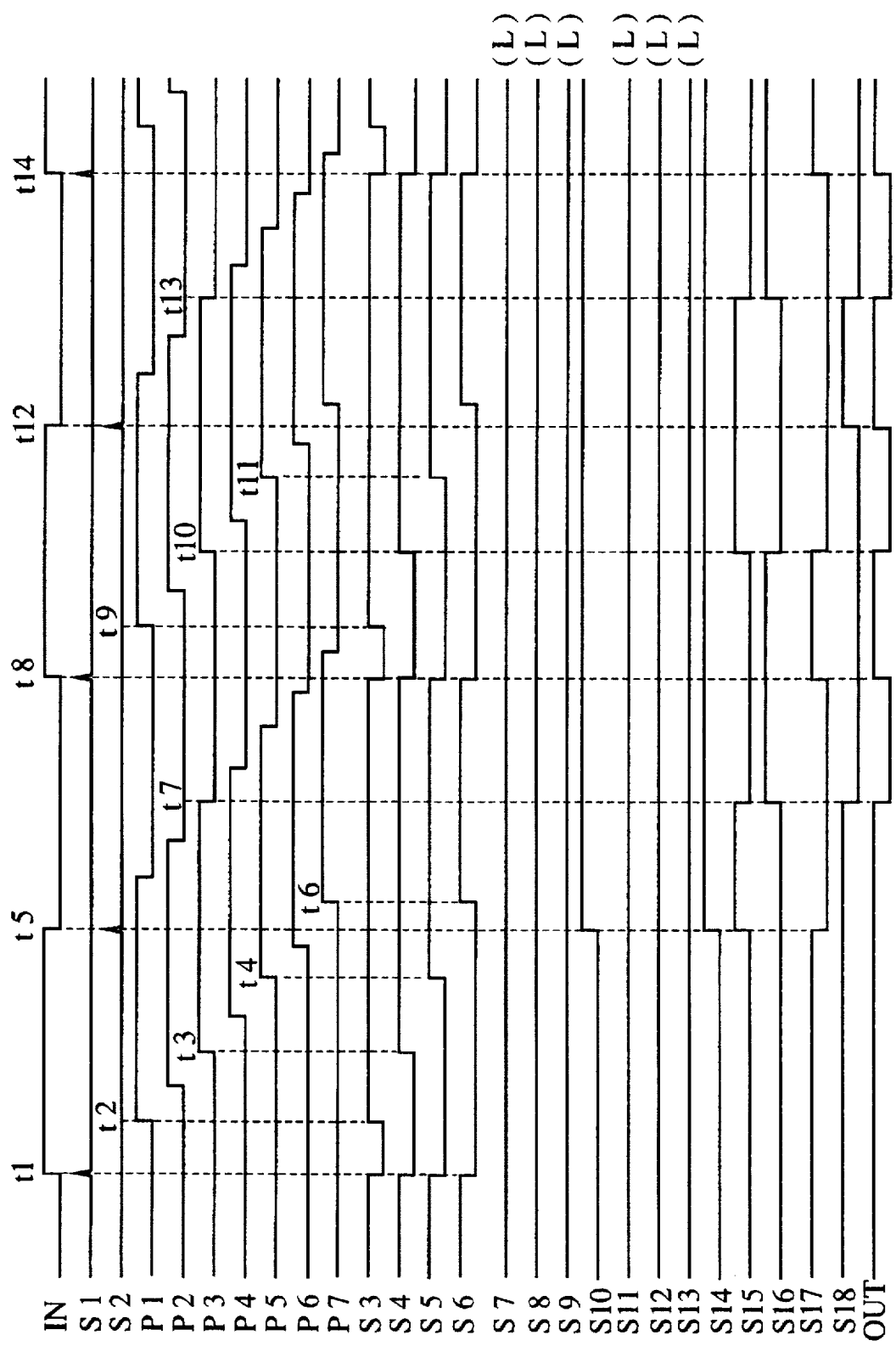
FIG. 5 is a timing chart showing the operation of the first embodiment.

In FIG. 5, the width of a high-level pulse of the signal IN is "a" and that of an adjacent low-level pulse is "b." Then, the width of a high-level pulse of the output clock signal OUT corresponding to the high-level pulse of the signal IN is about a/2, and the width of a high-level pulse thereof corresponding to the low-level pulse of the signal IN is about b/2.

Unlike the prior arts that are incapable of correcting a fluctuation in a delay time due to manufacturing variations or a change in a duty factor due to source voltage fluctuations, the first embodiment of the present invention measures the width of a pulse of the signal IN every clock cycle and changes a delay unit to be selected according to the pulse width, to deal with manufacturing variations or source voltage fluctuations, thereby maintaining an initial duty factor. The smaller the delay time of each delay unit in the delay circuit 10, the more the accuracy of duty factor correction is improved. The more the number of series-connected delay units contained in the delay circuit 10 is increased, the wider the range of allowable input frequencies is expanded.

Second Embodiment

Figure 6:
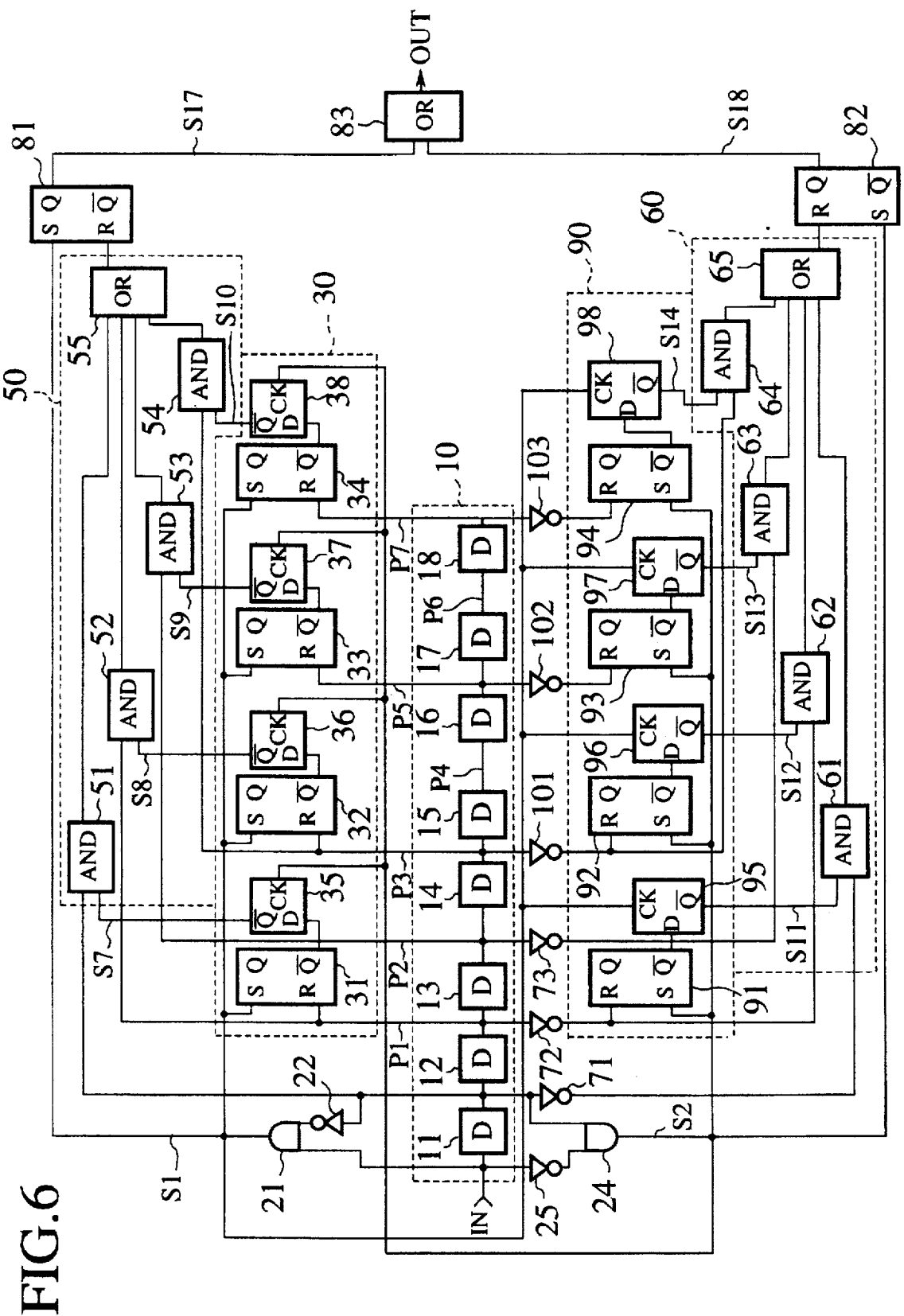
FIG. 6 is a circuit diagram showing a frequency multiplier according to a second embodiment of the present invention.

FIG. 6 is a circuit diagram showing a frequency multiplier according to the second embodiment of the present invention. The same parts as those of FIG. 4 are represented with like reference numerals. The second embodiment has, in addition to a first pulse width detector 30 (like the first embodiment of FIG. 4), a second pulse width detector 90, to measure the widths of high- and low-level pulses of an input clock signal IN.

The frequency multiplier of the second embodiment has a delay circuit 10 having delay units 11 to 18 that have each a given delay time and are connected in series to sequentially delay the signal IN. The first pulse width detector 30 measures and stores the width of a high-level pulse of the signal IN according to the outputs of the delay units 11 to 18. The second pulse width detector 90 measures and stores the width of a low-level pulse of the signal IN according to the outputs of the delay units 11 to 18. A first selector S0 selects one of the outputs of the delay units 11 to 18 according to the output of the first pulse width detector 30. A second selector 60 selects one of the inverted outputs of the delay units 11 to 18 according to the output of the second pulse width detector 90. A first output flip-flop 81 is reset according to the output of the first selector 50 and is set in response to a rising edge of the signal IN. A second output flip-flop 82 is reset according to the output of the second selector 60 and is set in response to a falling edge of the signal IN. An output circuit 83 synthesizes the outputs of the flip-flops 81 and 82 and provides a frequency-multiplied clock signal OUT.

The second pulse width detector 90 has flip-flops 91 to 94 and latches 95 to 98. An inverted output terminal $\overline{Q}$ of each of the flip-flops 91 to 94 is connected to a data input terminal D of a corresponding one of the latches 95 to 98. The latches 95 to 98 correspond to the latches 41 to 44 of FIG. 4. A clock terminal CK of each of the latches 95 to 98 receives a shot pulse S1. Reset terminals R of the flip-flops 91 to 94 receive the outputs P1, P3, P5, and P7 of the delay units 12, 14, 16, and 18 through inverters 72, 101, 102, and 103, respectively. A set terminal S of each of the flip-flops 91 to 94 receives a shot pulse S2.

The operation of the second embodiment is substantially the same as that of the first embodiment. In the first embodiment, the width of a high-level pulse of the signal IN is "a," that of a low-level pulse is "b," the width of a high-level pulse of the output clock signal OUT corresponding to the high-level pulse of the signal IN is about a/2, and that of a high-level pulse of the signal OUT corresponding to the low-level pulse of the signal IN is about b/2. On the other hand, in the second embodiment, the width of a high-level pulse of the output clock signal OUT corresponding to the width of each of high- and low-level pulses of the signal IN is about a/2.

In this way, the second embodiment measures the width of each of high- and low-level pulses of the signal IN, to correct a fluctuation in the duty factor of the signal IN.

Third Embodiment

Figure 7:
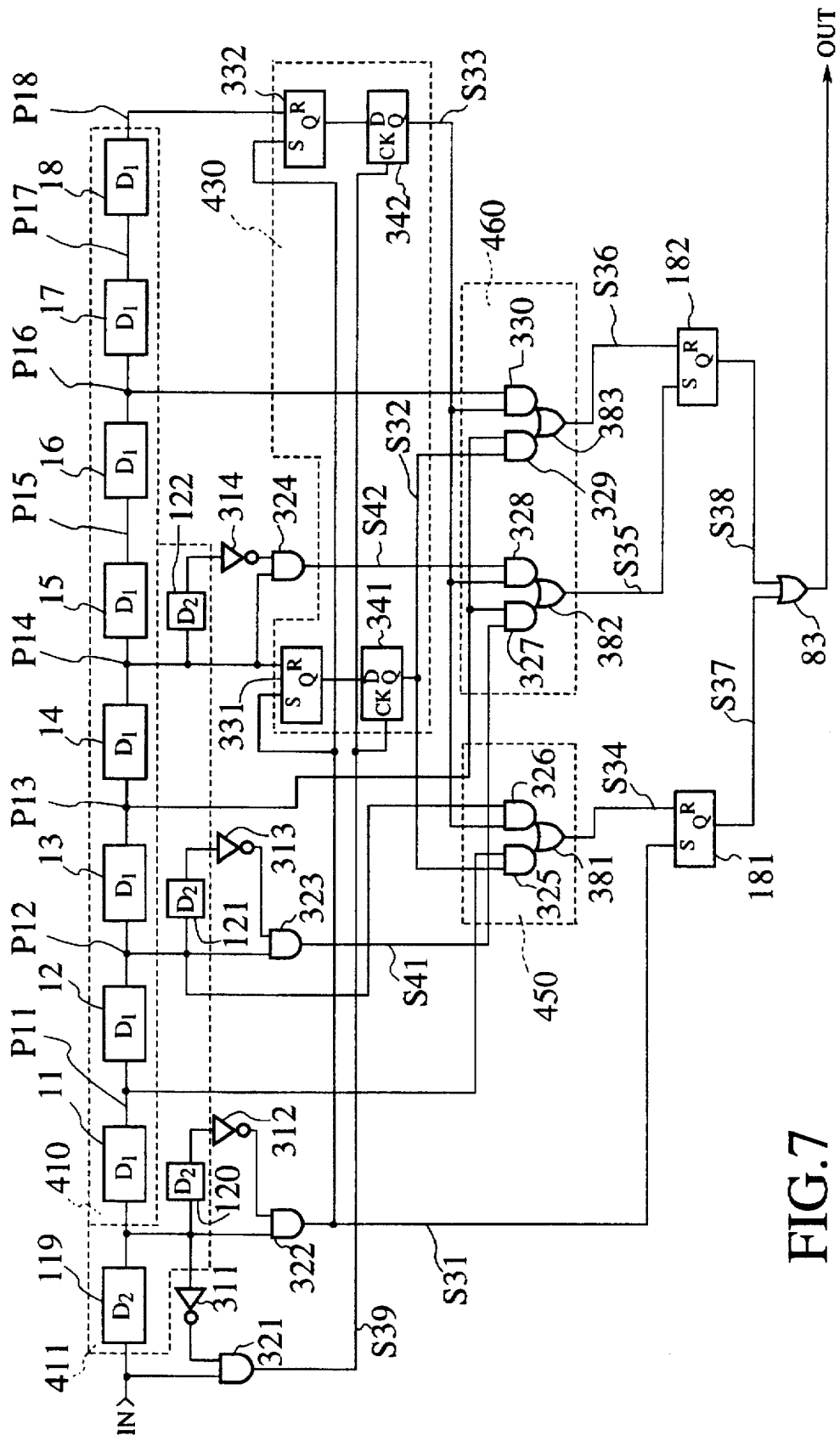
FIG. 7 is a circuit diagram showing a frequency multiplier according to a third embodiment of the present invention.

FIG. 7 is a circuit diagram showing a frequency multiplier according to the third embodiment of the present invention. The frequency multiplier has a first delay circuit 410 and a second delay circuit 411 to receive an input clock signal IN, a pulse width detector 430 for measuring and storing the width of a pulse of the signal IN according to the output of the delay circuit 410, a first selector 450 for selecting one of the outputs of delay units of the first delay circuit 410 according to the output of the pulse width detector 430, a second selector 460 for selecting one of the outputs of the delay units of the first delay circuit 410 according to the output of the pulse width detector 430, a first output flip-flop 181 that is reset according to the output of the first selector 450 and is set in response to a shot pulse S31 that is behind a rising edge of the signal IN by a given delay time, a second output flip-flop 182 that is reset and set according to the output of the second selector 460, and an output circuit 83 for synthesizing the outputs of the flip-flops 181 and 182 and providing a frequency-multiplied clock signal OUT.

The delay units 11 to 18 of the first delay circuit 410 have each a given delay time and are connected in series. Delay units 119 to 122 of the second delay circuit 411 have each a delay time that is shorter than the delay time of the delay units 11 to 18. An input terminal of the delay unit 119 is connected to an input terminal of an AND gate 321, and an output terminal of the delay unit 119 is connected to the other input terminal of the AND gate 321 through an inverter 311. An output terminal of the AND gate 321 provides a shot pulse S39 indicating a rising edge of the signal IN. An input terminal of the first delay unit 11 of the first delay circuit 410 is connected to an input terminal of an AND gate 322 whose the other input terminal is connected to an output terminal of the delay unit 120 of the second delay circuit 411 through an inverter 312. An output terminal of the AND gate 322 provides the shot pulse S31 that is behind a rising edge of the signal IN by the given time delay. The output P12 of the second delay unit 12 of the first delay circuit 410 is connected to an input terminal of an AND gate 323 whose the other input terminal is connected to the output P12 through the delay unit 121 of the second delay circuit 411 and an inverter 313. An output terminal of the AND gate 323 provides a shot pulse S41. The output P14 of the fourth delay unit 14 is connected to an input terminal of an AND gate 324 whose the other input terminal is connected to the output P14 through the delay unit 122 and an inverter 314. An output terminal of the AND gate 324 provides a shot pulse S42.

The pulse width detector 430 connected to the first delay circuit 410 detects the width of a high-level pulse of the signal IN. The pulse width detector 430 consists of flip-flops 331 and 332 and latches 341 and 342. An output terminal Q of each of the flip-flops 331 and 332 is connected to a data input terminal D of a corresponding one of the latches 341 and 342. A reset terminal R of the flip-flop 331 receives the output P14 of the fourth delay unit 14, and a set terminal S thereof receives the shot pulse S31. A reset terminal R of the flip-flop 332 receives the output P18 of the eighth delay unit 18, and a set terminal S thereof receives the shot pulse S31. A clock terminal CK of each of the latches 341 and 342 receives the shot pulse S39, and output terminals Q thereof provide signals S32 and S33, respectively.

The signals S32 and S33 are supplied to the first and second selectors 450 and 460. The first selector 450 consists of an AND gate 325 to receive the output P11 of the first delay circuit 410 and the output S32 of the latch 341, an AND gate 326 to receive the output P12 of the first delay circuit 410 and the output S33 of the latch 342, and an OR gate 381 to receive the outputs of the AND gates 325 and 326. The OR gate 381 provides a selected signal S34.

The second selector 460 consists of AND gates 327, 328, 329, and 330 and OR gates 382 and 383. The AND gates 327 and 329 receive the output P13 of the first delay circuit 410. The AND gate 330 receives the output P16 of the first delay circuit 410. The AND gate 328 receives the shot pulse S42. The AND gates 328 and 330 receive the signal S33 from the latch 342. The AND gate 327 receives the shot pulse S41. The AND gate 329 receives the signal S32 from the latch 341. The OR gates 382 and 383 provide selected signals S35 and S36, respectively.

The first and second output flip-flops 181 and 182 and OR gate 83 form an output circuit of the frequency multiplier. A set terminal S of the flip-flop 181 receives the shot pulse S31, a reset terminal R thereof receives the selected signal S34 from the first selector 450, and an output terminal Q thereof supplies a signal S37 to an input terminal of the OR gate 83. A set terminal S of the flip-flop 182 receives the selected signal S35 from the second selector 460, a reset terminal S thereof receives the selected signal S36 from the second selector 460, and an output terminal Q thereof supplies a signal S38 to the other input terminal of the OR gate 83. The OR gate 83 provides a frequency-multiplied clock signal OUT whose frequency is, for example, twice as large as that of the signal IN.

Figure 8:
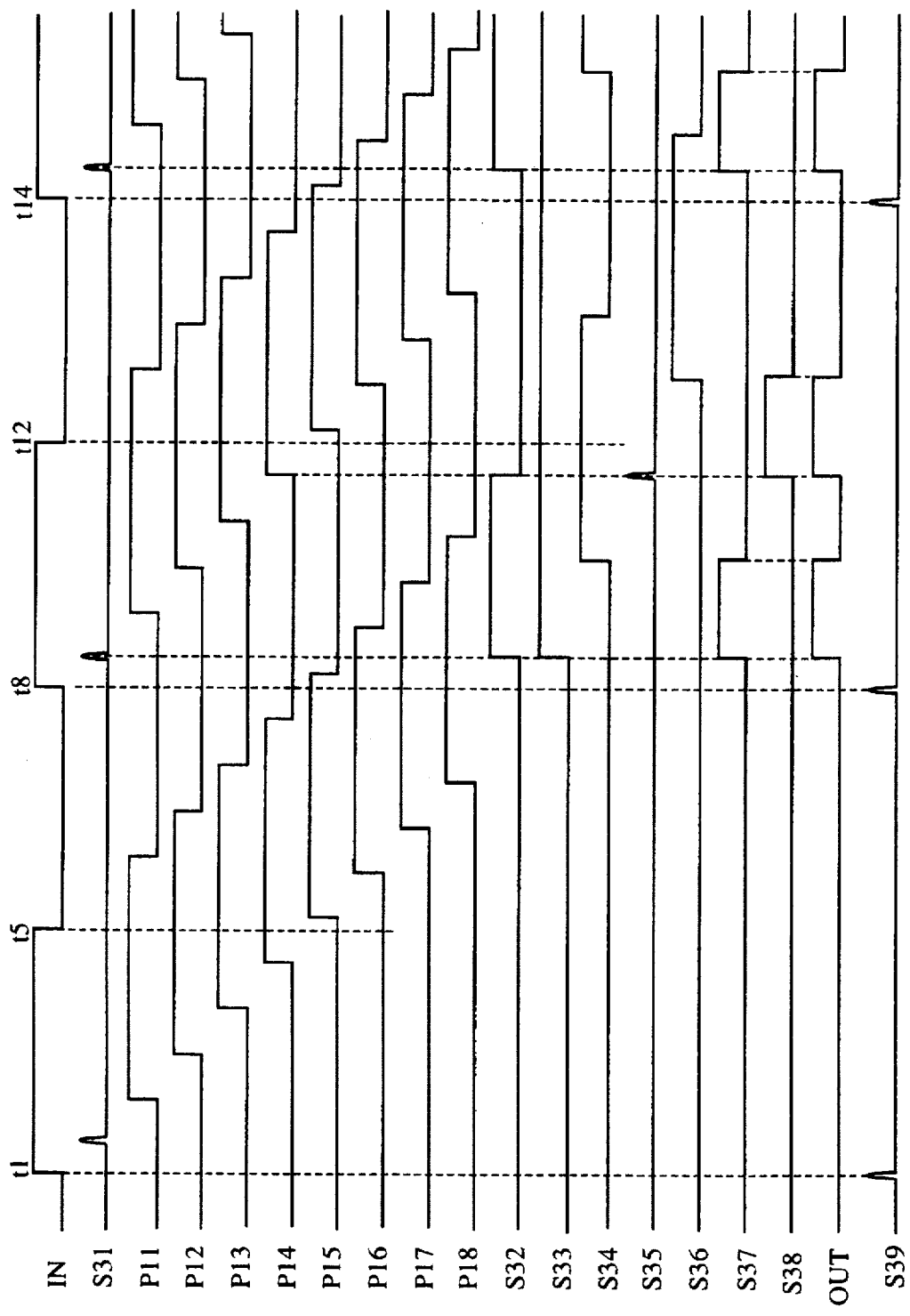
FIG. 8 is a timing chart showing the operation of the third embodiment.

FIG. 8 shows the operation of the frequency multiplier of the third embodiment. The third embodiment measures a period of the signal IN according to the outputs P11 to P18 of the delay circuit 410 and generates switching signals S32 and S33. The signal S34 that divides a period nearest to a predetermined value by four is selected. According to the selected signal S34, the flip-flop 181 generates the pulse S37 in the first half of the period, the duration of the pulse S37 being about ¼ of the period of the input signal IN. According to the selected signals S35 and S36, the flip-flop 182 generates the pulse S38 in the second half of the period, the duration of the pulse S38 being about ¼ of the period of the input signal IN. The OR gates 83 provides the sum of the pulses S37 and S38, to generate the clock signal OUT whose frequency is twice as large as that of the signal IN.

The delay time of the first and second delay circuits, the number of delay units contained in the first and second delay circuits, and the number of switching signals of the selector are determined according to the frequency and frequency range of the input signal. According to the third embodiment, the number of delay units in the first delay circuit is eight, and the number of switching signals is two. When the number of delay units and the number of switching signals are increased, the range of input signal frequencies may be wider, and the frequency multiplier may widely deal with manufacturing fluctuations. When the delay time of each delay unit is shortened, the frequency multiplier may correctly provide an output signal having a duty factor of about 50% irrespective of fluctuations in an input frequency.

Figure 9:
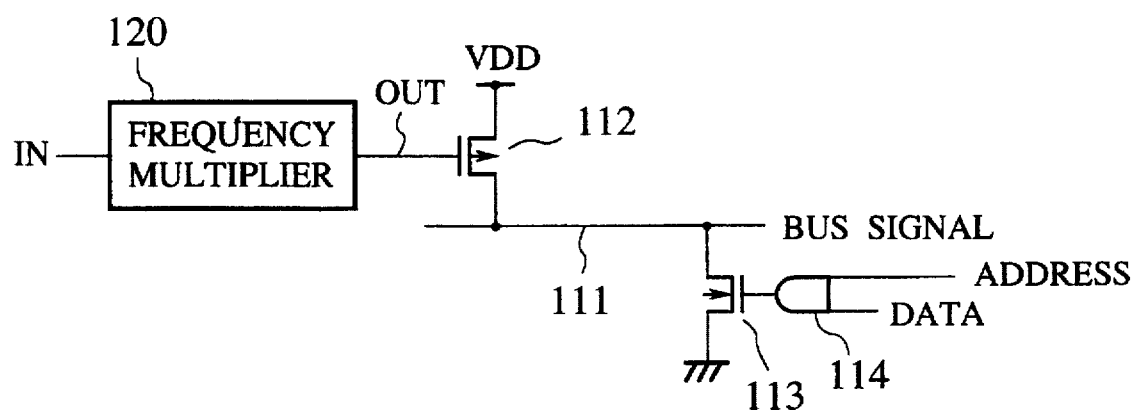
FIG. 9 is a circuit diagram showing a bus driver employing a frequency multiplier of the present invention.

Various modifications will become possible for those skilled in the art after receiving the teachings of the present disclosure without departing from the scope thereof. Since the frequency multiplier of the present invention is hardly affected by fluctuations in the characteristics of elements thereof, the present invention is useful to mass-produce semiconductor integrated circuits each having the frequency multiplier. FIG. 9 is a circuit diagram showing a bus driver employing the frequency multiplier of the present invention. Usually, the operation speed of a bus system of a semiconductor integrated circuit restricts the operation speed of the circuit itself. Namely, the operation speed of the bus system may be a bottleneck in improving the operation speed of the circuit. The present invention is capable of improving the operation speed of the bus driver. The bus driver consists of a charge transistor 112 arranged between a source voltage VDD and a bus line 111 and a discharge transistor 113 arranged between the bus line 111 and a ground GND. A frequency multiplier 120, which is based on any one of the first to third embodiments of the present invention, provides a frequency-multiplied clock signal OUT to turn on/off the charge transistor 112. The discharge transistor 113 is turned on/off according to the output of an AND gate 114 that receives address and data signals from a CPU and peripheral blocks.

Figure 10A:
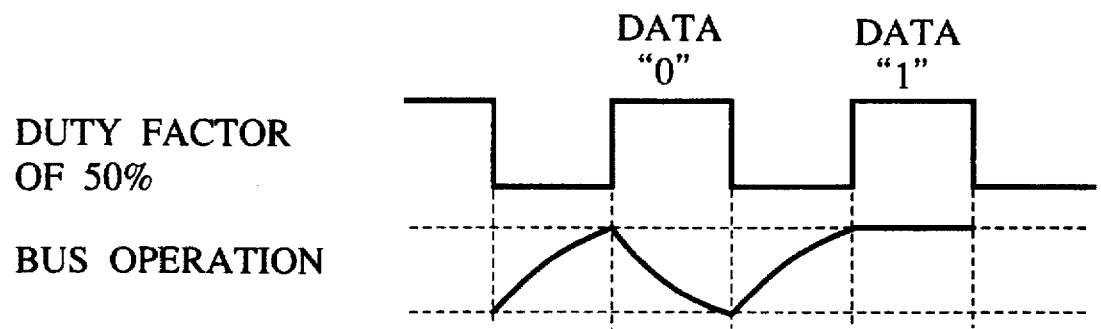
FIG. 10A is a waveform showing the operation of the bus driver of FIG. 9, comparing with FIGS. 10B and 10C, which show poor operations due to duty aberrations.
Figure 10B:
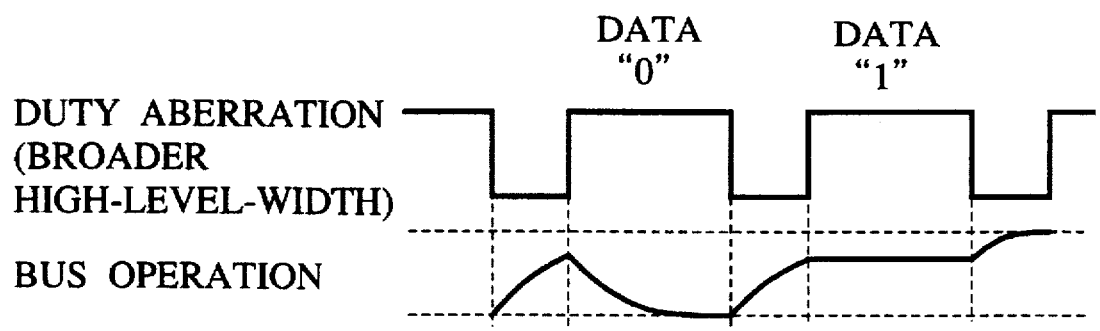
Figure 10C:
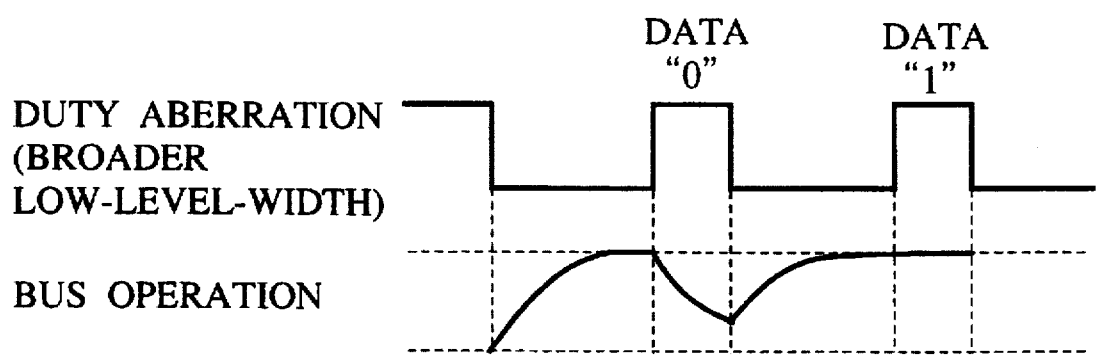

FIG. 10A is a waveform showing the operation of the bus driver of FIG. 9. When the duty factor of the output clock signal OUT is 50%, a bus operation is carried out normally as shown in FIG. 10A. In FIG. 10A, data "0" is read in response to a high-level pulse at the center, and data "1" is read in response to the next high-level pulse. The frequency multiplier 120 of the present invention for driving the charge transistor 112 is capable of correcting manufacturing variations and source voltage fluctuations, to maintain the duty factor of 50% of FIG. 10A. If the frequency multiplier of the prior art is employed to drive the charge transistor 112, it is incapable of correcting a fluctuation in a delay time due to manufacturing variations, or a fluctuation in the duty factor (duty aberration) due to source voltage fluctuations. As a result, the duty factor may deviate from 50% so that the width of a high-level pulse extends as shown in FIG. 10B. In this case, a precharge time will be short, and therefore, a high-level signal will not be provided to the bus line 111. If the duty factor deviates so that the width of a low-level pulse extends as shown in FIG. 10C, there will be a shortage of time for providing data. As a result, a low level is hardly provided to the bus line 111. The present invention improves the operation speed of the bus system, which involves a severe margin and is a bottleneck in improving the operation speed of the semiconductor integrated circuit, and maintains the duty factor of the output signal as shown in FIG. 10A. As a result, the present invention improves the operation speed of the semiconductor integrated circuit and stabilizes the operation thereof.

The frequency multiplier of the present invention, which stabilizes the duty factor of a signal against fluctuations in the characteristics of elements of the frequency multiplier, is applicable not only to the bus driver of FIG. 9 but also to any other semiconductor integrated circuits. The present invention is useful to mass-produce semiconductor integrated circuits at high yield and low cost. Since the frequency multiplier of the present invention consumes low power, it is advantageous in densely integrating semiconductor devices.

What is claimed is:

1. A frequency multiplier comprising:
   (a) a delay circuit consisting of delay units that each have a given delay time and are connected in series to sequentially delay an input clock signal;
   (b) a pulse width detector for measuring and storing a width of a pulse of the input clock signal according to a outputs of the delay units;
   (c) a first selector for selecting one of the outputs of the delay units according to an output of the pulse width detector;
   (d) a second selector for selecting one of inverted outputs of the delay units according to the output of the pulse width detector;
   (e) a first output flip-flop that is reset according to an output of the first selector and is set in response to a rising edge of the input clock signal;
   (f) a second output flip-flop that is reset according to an output of the second selector and is set in response to a falling edge of the input clock signal; and
   (g) an output circuit for synthesizing outputs of the first and second output flip-flops and providing a frequency-multiplied clock signal.

2. A frequency multiplier comprising:
   (a) a delay circuit consisting of delay units that each have a given delay time and are connected in series to sequentially delay an input clock signal;
   (b) a first pulse width detector for measuring and storing a width of a high-level pulse of the input clock signal according to outputs of the delay units;
   (c) a second pulse width detector for measuring and storing a width of a low-level pulse of the input clock signal according to outputs of the delay units;
   (d) a first selector for selecting one of the outputs of the delay units according to an output of the first pulse width detector;
   (e) a second selector for selecting one of inverted outputs of the delay units according to an output of the second pulse width detector;
   (f) a first output flip-flop that is reset according to an output of the first selector and is set in response to a rising edge of the input clock signal;
   (g) a second output flip-flop that is reset according to an output of the second selector and is set in response to a falling edge of the input clock signal; and
   (h) an output circuit for synthesizing outputs of the first and second output flip-flops and providing a frequency-multiplied clock signal.

3. A frequency multiplier comprising:
   (a) a delay circuit consisting of delay units that each have a given delay time and are connected in series to sequentially delay an input clock signal;
   (b) a rise detector for detecting a rising edge of the input clock signal;
   (c) a fall detector for detecting a falling edge of the input clock signal;
   (d) flip-flops that are reset according to outputs of the delay units and are set in response to a rising edge of the input clock signal;
   (e) latches for latching outputs of the flip-flops in response to a falling edge of the input clock signal;
   (f) a first selector for selecting one of the outputs of the delay units according to outputs of the latches;
   (g) a second selector for selecting one of inverted outputs of the delay units according to the outputs of the latches;
   (h) a first output flip-flop that is reset according to an output of the first selector and is set in response to a rising edge of the input clock signal;
   (i) a second output flip-flop that is reset according to an output of the second selector and is set in response to a falling edge of the input clock signal; and
   (j) an output circuit for synthesizing outputs of the first and second output flip-flops and providing a frequency-multiplied clock signal.

4. A frequency multiplier comprising:
   (a) a delay circuit consisting of delay units that each have a given delay time and are connected in series to sequentially delay an input clock signal;
   (b) a rise detector for detecting a rising edge of the input clock signal;
   (c) a fall detector for detecting a falling edge of the input clock signal;
   (d) first flip-flops that are reset according to outputs of the delay units and are set in response to a rising edge of the input clock signal;
   (e) second flip-flops that are reset according to inverted outputs of the delay units and are set in response to a falling edge of the input clock signal;
   (f) first latches for latching outputs of the first flip-flops in response to a falling edge of the input clock signal;
   (g) second latches for latching outputs of the second flip-flops in response to a rising edge of the input clock signal;
   (h) a first selector for selecting one of the delay units according to outputs of the first latches;
   (i) a second selector for selecting one of the inverted outputs of the delay units according to outputs of the second latches;
   (j) a first output flip-flop that is reset according to an output of the first selector and is set in response to a rising edge of the input clock signal;
   (k) a second output flip-flop that is reset according to an output of the second selector and is set in response to a falling edge of the input clock signal; and
   (l) an output circuit for synthesizing outputs of the first and second output flip-flops and providing a frequency-multiplied clock signal.

5. A frequency multiplier comprising:
   (a) a first delay circuit consisting of delay units that each have a given delay time and are connected in series to sequentially delay an input clock signal;

(b) a second delay circuit consisting of delay units that each have a given delay time, each delay unit connected to predetermined ones of the delay units of the first delay circuit;

(c) a pulse width detector for measuring and storing a width of a pulse of the input clock signal according to outputs of the delay units in the first delay circuit;

(d) a first selector for selecting one of the outputs of the delay units in the first delay circuit according to an output of the pulse width detector;

(e) a second selector for selecting one of the outputs of the delay units in the first delay circuit according to the output of the pulse width detector;

(f) a first output flip-flop that is reset according to an output of the first selector and is set in response to a shot pulse that is behind a rising edge of the input clock signal by the delay time of the delay unit in the second delay circuit;

(g) a second output flip-flop that is set and reset according to an output of the second selector; and (h) an output circuit for synthesizing outputs of the first and second output flip-flops and providing a frequency-multiplied clock signal.

6. The frequency multiplier of claim 5, wherein the delay time of the delay unit of the second delay circuit is shorter than that of the first delay circuit.

7. The frequency multiplier of claim 5, wherein one of the delay unit of the second delay circuit is connected to input side of the first delay unit of the first delay circuit.

8. The frequency multiplier of claim 7, wherein the shot pulse is an AND of an input signal to the first delay unit of the first delay circuit and an inverted output of one of the delay unit of the second delay circuit.

9. The frequency multiplier of claim 5, wherein two delay units of the second delay circuit are connected to an input side of the first delay unit of the first delay circuit, one delay unit of the second delay circuit is connected to an input side of a third delay unit of the first delay circuit, and one delay unit of the second delay circuit is connected to an input side of a fifth delay unit of the first delay circuit.

10. The frequency multiplier of claim 5, wherein the pulse width detector consists of flip-flops that are set in response to the shot pulse that is behind a rising edge of the input clock signal by the predetermined time delay and are reset according to the outputs of predetermined ones of the delay units in the first delay circuit, and latches for latching the outputs of the flip-flops in response to a rising edge of the input clock signal.

11. A semiconductor integrated circuit for driving a bus line, comprising:

a frequency multiplier, including,
(a) a delay circuit consisting of delay units that each have a given delay time and are connected in series to sequentially delay an input clock signal,
(b) a pulse width detector for measuring and storing a width of a pulse of the input clock signal according to outputs of the delay units,
(c) a first selector for selecting one of the outputs of the delay units according to an output of the pulse width detector,
(d) a second selector for selecting one of inverted outputs of the delay units according to the output of the pulse width detector,
(e) a first output flip-flop that is reset according to an output of the first selector and is set in response to a rising edge of the input clock signal,
(f) a second output flip-flop that is reset according an output of the second selector and is set in response to a falling edge of the input clock signal, and
(g) an input circuit for synthesizing outputs of the first and second output flip-flops and providing a frequency-multiplied clock signal; and a charge transistor to be turned on and off according to the frequency-multiplied clock signal provided by the frequency multiplier, to precharge the bus line.

12. A semiconductor integrated circuit for driving a bus line, comprising:

a frequency multiplier, including,
(a) a delay circuit consisting of delay units that each have a given delay time and are connected in series to sequentially delay an input clock signal,
(b) a first pulse width detector for measuring and storing a width of a high-level pulse of the input clock signal according to outputs of the delay units,
(c) a second pulse width detector for measuring and storing a width of a low-level pulse of the input clock signal according the outputs of the delay units,
(d) a first selector for selecting one of the outputs of the delay units according to an output of the first pulse width detector,
(e) a second selector for selecting one of inverted outputs of the delay units according to an output of the second pulse width detector,
(f) a first output flip-flop that is reset according to an output of the first selector and is set in response to a rising edge of the input clock signal,
(g) a second output flip-flop that is reset according to an output of the second selector and is set in response to a falling edge of the input clock signal, and
(h) an output circuit for synthesizing outputs of the first and second output flip-flops and providing a frequency-multiplied clock signal; and a charge transistor to be turned on and off according to the frequency-multiplied signal provided by the frequency multiplier, to precharge the bus line.

13. A semiconductor integrated circuit for driving a bus line, comprising:

a frequency multiplier, including,
(a) a delay circuit consisting of delay units that each have a given delay time and are connected in series to sequentially delay an input clock signal,
(b) a rise detector for detecting a rising edge of the input clock signal,
(c) a fall detector for detecting a falling edge of the input clock signal,
(d) flip-flops that are reset according to outputs of the delay units and are set in response to a rising edge of the input clock signal,
(e) latches for latching outputs of the flip-flops in response to a falling edge of the input clock signal,
(f) a first selector for selecting one of the outputs of the delay units according to outputs of the latches,
(g) a second selector for selecting one of inverted outputs of the delay units according to the outputs of the latches,
(h) a first output flip-flop that is reset according to an output of the first selector and is set in response to a rising edge of the input clock signal,
(i) a second output flip-flop that is reset according to an output of the second selector and is set in response to a falling edge of the input clock signal, and
(j) an output circuit for synthesizing outputs of the first and second output flip-flops and providing a frequency-multiplied clock signal; and a charge transistor to be turned on and off according to the frequency-multiplied clock signal provided by the frequency multiplier, to precharge the bus line.

14. A semiconductor integrated circuit for driving a bus line, comprising:

a frequency multiplier, including,
  (a) a delay circuit consisting of delay units that each have a given delay time and are connected in series to sequentially delay an input clock signal,
  (b) a rise detector for detecting a rising edge of the input clock signal,
  (c) a fall detector for detecting a falling edge of the input clock signal,
  (d) first flip-flops that are reset according to outputs of the delay units and are set in response to a rising edge of the input clock signal,
  (e) second flip-flops that are reset according to inverted outputs of the delay units and are set in response to a falling edge of the input clock signal,
  (f) first latches for latching outputs of the first flip-flops in response to a falling edge of the input clock signal,
  (g) second latches for latching outputs of the second flip-flops in response to a rising edge of the input clock signal,
  (h) a first selector for selecting one of the delay units according to outputs of the first latches,
  (i) a second selector for selecting one of the inverted outputs of the delay units according to outputs of the second latches,
  (j) a first output flipflop that is reset according to an output of the first selector and is set in response to a rising edge of the input clock signal,
  (k) a second output flip-flop that is reset according to an output of the second selector and is set in response to a falling edge of the input clock signal, and
  (l) an output circuit for synthesizing outputs of the first and second output flip-flops and providing a frequency-multiplied clock signal; and a charge transistor to be turned on and off according to the frequency-multiplied clock signal provided by the frequency multiplier, to precharge the bus line.

15. A semiconductor integrated circuit for driving a bus line, comprising:

a frequency multiplier, including,
  (a) a first delay circuit consisting of delay units that each have a given delay time and are connected in series to sequentially delay an input clock signal,
  (b) a second delay circuit consisting of delay units that each have a given delay time, each delay unit connected to predetermined ones of the delay units of the first delay circuit,
  (c) a pulse width detector for measuring and storing a width of a pulse of the input clock signal according to outputs of the delay units in the first delay circuit,
  (d) a first selector for selecting one of the outputs of the delay units in the first delay circuit according to an output of the pulse width detector,
  (e) a second selector for selecting one of the outputs of the delay units in the first delay circuit according to the output of the pulse width detector,
  (f) a first output flip-flop that is reset according to an output of the first selector and is set in response to a shot pulse that is behind a rising edge of the input clock signal by the delay time of the delay unit in the second delay circuit,
  (g) a second output flip-flop that is set and reset according to an output of the second selector, and
  (h) an output circuit for synthesizing output of the first and second output flip-flops and providing a frequency-multiplied clock signal; and a charge transistor to be turned on and off according to the frequency-multiplied clock signal provided by the frequency multiplier for precharging the bus line, wherein the frequency multiplier and the charge transistor are formed on a same semiconductor chip.

* * * * *